United States Patent
Maheshwari et al.

(10) Patent No.: US 8,451,064 B2
(45) Date of Patent: May 28, 2013

(54) VOLTAGE-CONTROLLED OSCILLATOR MODULE HAVING ADJUSTABLE OSCILLATOR GAIN AND RELATED OPERATING METHODS

(75) Inventors: Sanjeev Maheshwari, Fremont, CA (US); Emerson Fang, Fremont, CA (US); Sanjeev Aggarwal, Santa Clara, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 176 days.

(21) Appl. No.: 12/900,163

(22) Filed: Oct. 7, 2010

(65) Prior Publication Data

US 2012/0086482 A1    Apr. 12, 2012

(51) Int. Cl.
*H03L 7/18* (2006.01)

(52) U.S. Cl.
USPC .................. 331/16; 331/176; 331/57; 331/34; 327/156

(58) Field of Classification Search
USPC .......................... 331/16, 34, 176, 57; 327/156
See application file for complete search history.

(56) References Cited

U.S. PATENT DOCUMENTS 8,183,934 B2 * 5/2012 Yamabana et al. .............. 331/14

OTHER PUBLICATIONS

Utility U.S. Appl. No. 12/875,337, filed Sep. 3, 2010.

* cited by examiner

*Primary Examiner* — Arnold Kinkead
(74) *Attorney, Agent, or Firm* — Ingrassia Fisher & Lorenz, P.C.

(57) ABSTRACT

Apparatus and methods are provided for oscillators having adjustable gain. An exemplary oscillator module comprises a first node for a first voltage, a control node for a control signal, and oscillator circuitry coupled to the first node and the control node. The oscillator circuitry generates an output signal with a first oscillation frequency based on the first voltage, and in response to the control signal being asserted, the oscillator circuitry generates the output signal with a second oscillation frequency based on the first voltage. The second oscillation frequency is greater than the first oscillation frequency.

13 Claims, 5 Drawing Sheets

VOLTAGE-CONTROLLED OSCILLATOR MODULE HAVING ADJUSTABLE OSCILLATOR GAIN AND RELATED OPERATING METHODS

TECHNICAL FIELD

Embodiments of the subject matter described herein relate generally to electronic circuits, and more particularly, voltage-controlled oscillators having adjustable oscillator gain.

BACKGROUND

Voltage-controlled oscillators (VCOs) are commonly used to generate an output signal having a particular oscillation frequency based on an applied reference voltage. In this regard, the VCO oscillator gain corresponds to the ratio between the oscillation frequency of the VCO to the applied reference voltage. In practice, process, voltage, and temperature (PVT) variations affect the operating parameters for components of the VCO, which in turn, affect the oscillator gain, and thus, the range of oscillation frequencies achievable by the VCO over a range of applied voltages. In practical systems, the range of possible applied voltages for the VCO may be limited. Thus, if the oscillator gain is too low or too high (e.g., due to PVT variations), the applied voltage may not be able to compensate for variations in the oscillator gain, and as a result, the VCO may not be able to achieve the oscillation frequency (or a range thereof) that is desired for a particular application.

BRIEF SUMMARY

In general, an apparatus for an oscillator having adjustable gain is provided. The oscillator module includes a first node for a first voltage, a control node for a control signal, and oscillator circuitry coupled to the first node and the control node. The oscillator circuitry is configured to generate an output signal with a first oscillation frequency based on the first voltage in response to the control signal having a first state, and generate the output signal with a second oscillation frequency based on the first voltage in response to the first control signal having a second state. The second oscillation frequency is greater than the first oscillation frequency.

In one embodiment, an apparatus for a computing module is provided. The computing module includes a digital phase-locked loop and circuitry configured to communicate data over a serial interface in synchronization with an output signal generated by the digital phase-locked loop. The digital phase-locked loop comprises an oscillator module configured to generate the output signal with a first oscillation frequency based on a reference voltage and a ratio of output frequency to applied voltage for the oscillator module, wherein the ratio of output frequency to applied voltage is adjustable. The digital phase-locked loop also includes a frequency control module coupled to the oscillator module, wherein the frequency control module is configured to increase the ratio of output frequency to applied voltage based on the reference voltage.

In another embodiment, a method is provided for operating a voltage-controlled oscillator (VCO) module. The method comprises providing a reference voltage to the VCO module and generating, by the VCO module, an output signal having a first oscillation frequency, the first oscillation frequency corresponding to the reference voltage multiplied by an oscillator gain for the VCO module. The method further comprises increasing the oscillator gain when the reference voltage is greater than a threshold voltage, and in response to increasing the oscillator gain, generating the output signal with a second oscillation frequency based on the reference voltage, the second oscillation frequency being greater than the first oscillation frequency.

This summary is provided to introduce a selection of concepts in a simplified form that are further described in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Technologies and concepts discussed herein relate to voltage-controlled oscillators (VCOs) suitable for generating an output signal having an oscillation frequency that is dependent upon an applied voltage. In this regard, the oscillation frequency corresponds to the applied voltage multiplied by an oscillator gain factor corresponding to a ratio of oscillation frequency to applied voltage for the VCO. As described in greater detail below, an exemplary VCO includes adjustable inverter circuitry adapted to allow the oscillator gain (i.e., the ratio of oscillation frequency to applied voltage) of the VCO to be adjusted based upon the magnitude of the applied voltage. As a result, the VCO may be capable of achieving a desired range of oscillation frequencies over a limited applied voltage range regardless of process, voltage, and/or temperature (PVT) variations that may otherwise affect the oscillator gain and limit the ability of the VCO to achieve the desired range of oscillation frequencies. Additionally, the VCO may be designed such that the voltage applied to the VCO is maintained within a predetermined range of voltages to ensure other operating components utilizing the applied voltage operate in their intended manner.

Figure 1:
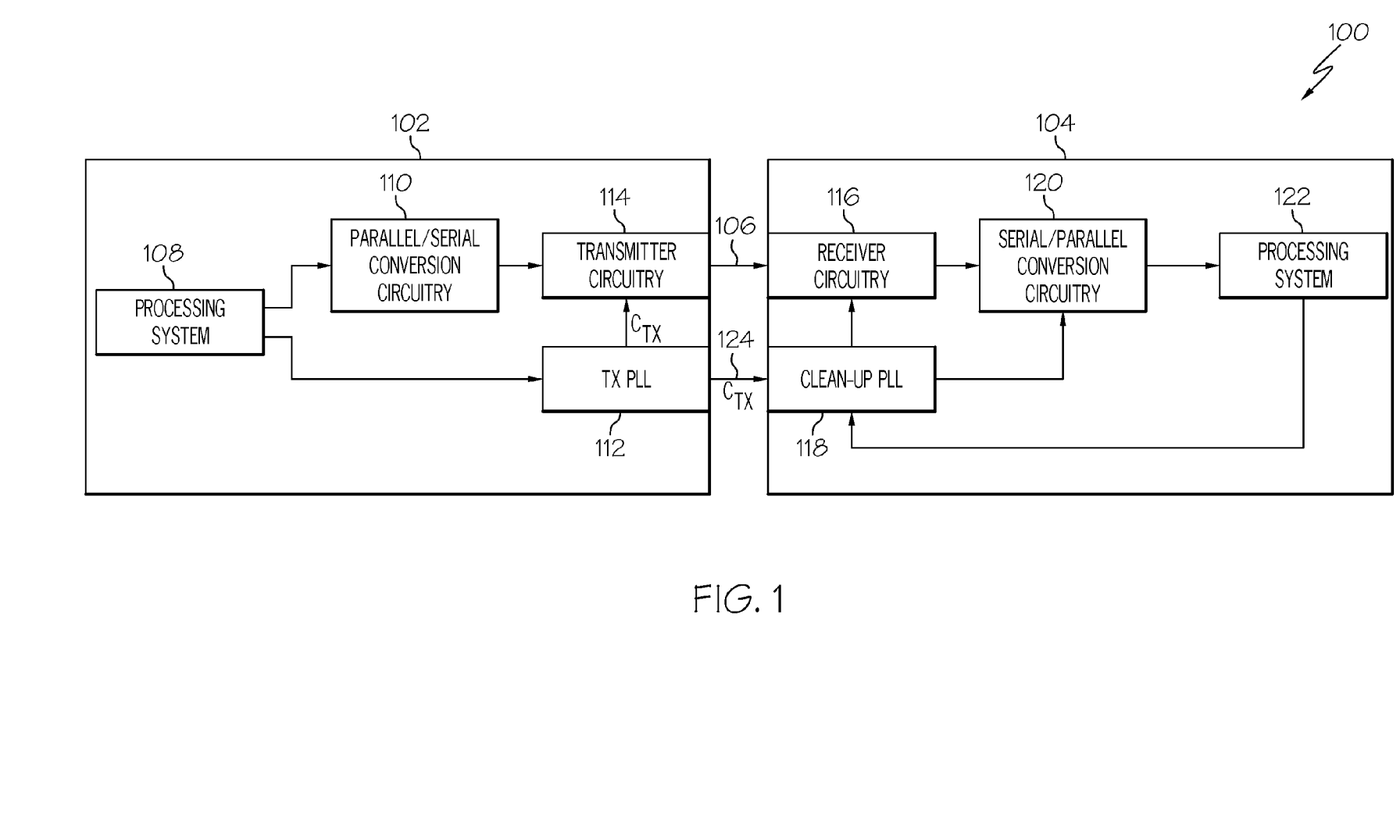
FIG. 1 is a block diagram of a system for communicating between two computing modules in accordance with one embodiment.

FIG. 1 depicts an exemplary embodiment of a system 100 for communicating data over a serial interface 106 from a first computing module 102, such as a processor, central processing unit (CPU), graphics processing unit (GPU), or the like, to a second computing module 104 (e.g., another processor, CPU, GPU, or the like). It should be understood that FIG. 1 is a simplified representation of a system 100 for purposes of explanation and ease of description, and FIG. 1 is not intended to limit the subject matter in any way. Practical embodiments of system 100 may include other devices and components for providing additional functions and features, and/or the computing modules 102, 104 may be part of a larger system, as will be understood. In this regard, it should be understood that although the subject matter may be described in the context of communicating data from the first computing module 102 to the second computing module 104, the subject matter may be implemented in a like manner for communicating data from the second computing module 104 to the first computing module 102 or for communicating data to other modules not illustrated in FIG. 1, and in some embodiments, the serial interface 106 may be utilized for bidirectional communication between computing modules 102, 104. Furthermore, although FIG. 1 depicts the computing modules 102, 104 as distinct elements (e.g., separate chips and/or device packages), in some embodiments, the computing modules 102, 104 may be implemented as part of a common device package.

In an exemplary embodiment, the first computing module 102 includes, without limitation, a processing system 108, parallel-to-serial conversion circuitry 110, a transmit phase-locked loop (PLL) 112, and transmitter circuitry 114 configured to transmit or otherwise communicate serialized data over the serial interface 106. The processing system 108 generally represents the main processing core for the first computing module 102. In various embodiments, the processing system 108 may be realized using one or more arithmetic logic units (ALUs), one or more floating point units (FPUs), one or more memory elements (e.g., one or more caches), discrete gate or transistor logic, discrete hardware components, or any combination thereof. The processing system 108 is coupled to the parallel-to-serial conversion circuitry 110 and generates or otherwise provides parallelized (or multi-bit) data to be transmitted to the second computing module 104, and provides the parallel data to the parallel-to-serial conversion circuitry 110. The parallel-to-serial conversion circuitry 110 is coupled between the processing system 108 and the transmitter circuitry 114, and the parallel-to-serial conversion circuitry 110 generally represents the hardware components that are configured to convert parallel data from the processing system 108 to serialized data capable of being transmitted or otherwise communicated over the serial interface 106. The processing system 108 is also coupled to the transmit PLL 112 and generates or otherwise provides a reference clock signal that is used as a reference signal by the transmit PLL 112 to generate an output signal for synchronizing the data being transmitted over the serial interface 106. In some embodiments, the reference clock signal may be provided by another component of the first computing module 102, such as a crystal oscillator or another local oscillator, as will be appreciated in the art.

In the illustrated embodiment, the transmit PLL 112 is coupled to the transmitter circuitry 114, and based on the reference clock signal received from the processing system 108, the transmit PLL 112 generates a transmit clock signal (or source-synchronous clock signal) that is used by the transmitter circuitry 114 to transmit bits of the serialized data over the serial interface 106 in sync with the transmit clock signal ($C_{TX}$). In an exemplary embodiment, the frequency of the transmit clock signal ($C_{TX}$) is greater than 1 GHz, and is typically within the range of about 3 GHz to about 6 GHz, although higher frequencies may be utilized in some embodiments. In accordance with one or more embodiments, the transmit clock signal is a half-rate clock signal, that is, the frequency of the transmit clock signal is one half the frequency of the data rate for the serial data being transmitted over serial interface 106. The illustrated embodiment of FIG. 1 depicts a source-synchronous system, wherein the transmit PLL 112 is also coupled to a second serial interface 124 and configured to communicate the transmit clock signal ($C_{TX}$) over the second serial interface 124 to the second computing module 104 to support source-synchronous communications between computing modules 102, 104. The transmitter circuitry 114 generally represents the hardware components of the first computing module 102 that are configured to sequentially transmit individual bits of the serialized data from the output of parallel-to-serial conversion circuitry 110 over the serial interface 106 in sync with the transmit clock signal ($C_{TX}$) received from the transmit PLL 112.

In the illustrated embodiment, the second computing module 104 includes, without limitation, receiver circuitry 116 for receiving or otherwise communicating data over the serial interface 106, a clean-up PLL 118, serial-to-parallel conversion circuitry 120, and a second processing system 122. As illustrated in FIG. 1, the clean-up PLL 118 is coupled to the serial interface 124 and receives the transmit clock signal ($C_{TX}$) generated by the transmit PLL 112. In an exemplary embodiment, the clean-up PLL 118 is realized as a digital PLL that removes high frequency jitter and/or distortion from the signal received from the serial interface 124 before providing the cleaned-up clock signal to the receiver circuitry 116. As used herein, a digital PLL should be understood as referring to a PLL that changes the frequency of its output signal by fixed amounts based on the relative phase differences between its output signal and its input reference signal ($C_{TX}$). As described in greater detail below, in an exemplary embodiment, the clean-up PLL 118 is configured to adjust the frequency of the cleaned-up clock signal based on the phase difference between the cleaned-up clock signal and the transmit clock signal ($C_{TX}$) from the serial interface 124.

In an exemplary embodiment, the receiver circuitry 116 is coupled to the clean-up PLL 118 and generally represents the hardware components of the second computing module 104 that are coupled to the serial interface 106 and configured to convert electrical signals on the serial interface 106 to serialized digital values that are synchronized with the cleaned-up clock signal received from the clean-up PLL 118. The serial-to-parallel conversion circuitry 120 is coupled to the output of the receiver circuitry 116 and the output of the clean-up PLL 118, and the serial-to-parallel conversion circuitry 120 generally represents the hardware components of the second computing module 104 that are configured to convert the serialized data from the receiver circuitry 116 that are synchronized with the transmit clock signal ($C_{TX}$) to parallel data that is synchronized with the clock domain of the processing system 122. The processing system 122 generally represents the main processing core for the second computing module 104, and the processing system 122 is coupled to the output of the serial-to-parallel conversion circuitry 120 and configured to receive and/or act upon the data from the serial-to-parallel conversion circuitry 120 in a conventional manner. Depending on the embodiment, the processing system 122 may be realized using one or more ALUs, one or more FPUs, one or more memory elements, discrete gate or transistor logic, discrete hardware components, or any combination thereof.

Figure 2:
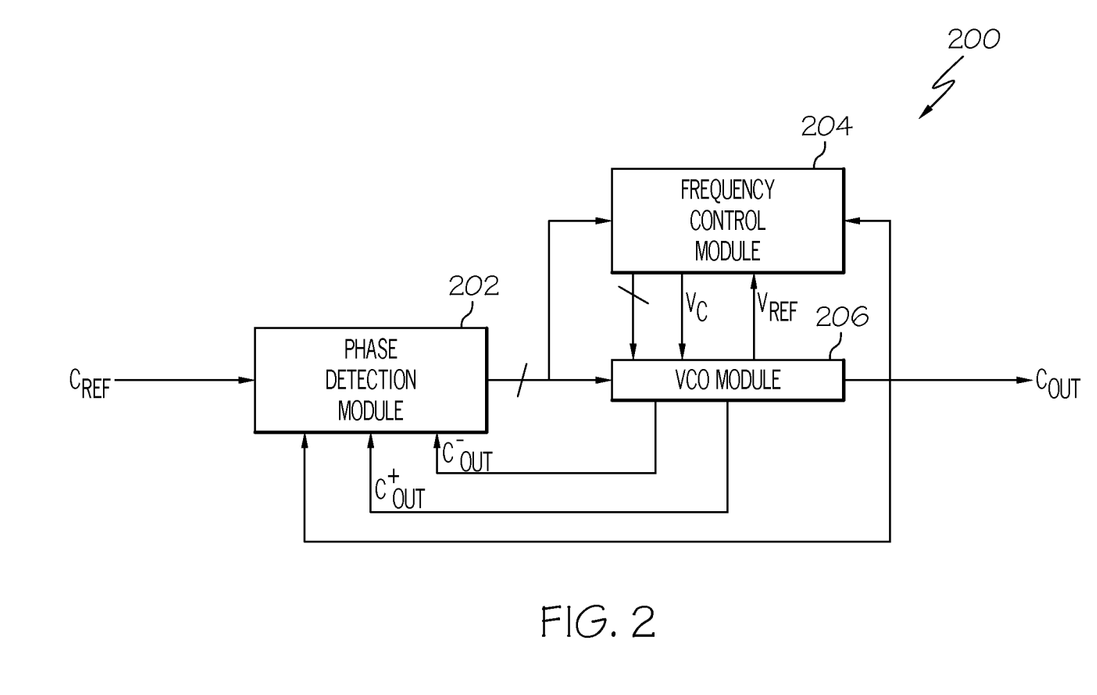
FIG. 2 is a block diagram of a digital phase-locked loop suitable for use in the system of FIG. 1 in accordance with one embodiment.

FIG. 2 depicts an exemplary embodiment of a digital PLL 200 suitable for use in the system 100 of FIG. 1. The illustrated embodiment of PLL 200 includes, without limitation, a phase detection module 202, a frequency control module 204, and a voltage-controlled oscillator (VCO) module 206. The elements of the PLL 200 are suitably configured to produce an output signal ($C_{OUT}$) having a particular oscillation frequency ($f_{OUT}$) in response to an input reference signal ($C_{REF}$), wherein the oscillation frequency is adjusted based on the phase difference between the input reference signal ($C_{REF}$) and the output signal ($C_{OUT}$) to lock the phase of the output signal to the phase of the input reference signal, as described in greater detail below. In the illustrated embodiment, in addition to the output signal ($C_{OUT}$), the VCO module 206 is configured to generate a first feedback signal that corresponds to a leading (or time advanced) version of the output signal ($C_{OUT}^+$) and a second feedback signal that corresponds to a lagging (or time delayed) version of the output signal ($C_{OUT}^-$). For convenience, the leading version of the output signal ($C_{OUT}^+$) may alternatively be referred to herein as the leading feedback signal and the lagging version of the output signal ($C_{OUT}^-$) may alternatively be referred to herein as the lagging feedback signal.

In an exemplary embodiment, the digital PLL 200 is utilized as the clean-up PLL 118 in the second computing module 104 of FIG. 1, wherein the input reference signal corresponds to the transmit clock signal generated by the transmit PLL 112 and received from the first computing module 102 over the second serial interface 124 (e.g., $C_{REF}=C_{TX}$) and the output signal ($C_{OUT}$) corresponds to the cleaned-up clock signal that is provided to the receiver circuitry 116 and/or serial-to-parallel conversion circuitry 120. However, in other embodiments, the input reference signal may be provided by a component of the second computing module 104, such as a crystal oscillator or another local oscillator, processing system 122, or another PLL. Although the subject matter may be described herein in the context of using the PLL 200 as a clean-up PLL (e.g., clean-up PLL 118) for source-synchronous communications, in other embodiments, the digital PLL 200 may be utilized for clock data recovery or other applications.

In an exemplary embodiment, the phase detection module 202 is coupled to the output of the VCO module 206, and the phase detection module 202 generally represents the hardware and/or other components configured to receive the input reference signal ($C_{REF}$) and feedback signals ($C_{OUT}^+$, $C_{OUT}^-$) from the VCO module 206 and generate adjustment signals indicative of the amount of phase difference between the input reference signal $C_{REF}$) and the output signal ($C_{OUT}$) to produce a corresponding adjustment in the oscillation frequency of the output signal ($C_{OUT}$). The frequency control module 204 is coupled to the output of the phase detection module 202 and the output of the VCO module 206, and the frequency control module 204 generally represents the hardware and/or other components configured to calibrate the VCO module 206 and ensure the oscillation frequency of the output signal ($C_{OUT}$) is maintained within a predetermined percentage of the frequency of the input reference signal ($C_{REF}$). For example, in accordance with one embodiment, the frequency control module 204 ensures the output signal is maintained within about 2000 parts per million of the input reference signal (or within 0.2% of the frequency of the input reference signal). In an exemplary embodiment, the frequency control module 204 generates or otherwise provides a control reference voltage ($V_C$) to the VCO module 206. Additionally, although the subject matter may be described herein in the context of calibrating the VCO module 206 for use in digital PLL 200, in practice, the frequency control module 204 may also periodically adjust the control reference voltage ($V_C$) provided to the VCO module 206 to aid in frequency locking during normal operation of the digital PLL 200.

The VCO module 206 generally represents the hardware and/or other components configured to generate the output signal $C_{OUT}$) with an oscillation frequency based on the control reference voltage ($V_C$) from the frequency control module 204. As described in greater detail below, the VCO module 206 includes oscillation circuitry, wherein the control reference voltage ($V_C$) regulates or otherwise controls the voltage applied to the oscillator circuitry (alternatively referred to herein as the oscillator reference voltage), and thereby the oscillation frequency of the output signal ($C_{OUT}$). In this manner, the control reference voltage ($V_C$)) is directly related to the oscillator reference voltage). For clarity and ease of explanation, the control reference voltage ($V_C$) is alternatively referred to herein as the control voltage and the oscillator reference voltage ($V_{REF}$) is alternatively referred to herein as the reference voltage or applied voltage.

As described in greater detail below, in an exemplary embodiment, the frequency control module 204 generates or otherwise provides control signals to the VCO module 206 to adjust the oscillator gain, that is, the ratio of the oscillation frequency ($f_{OUT}$) of the output signal ($C_{OUT}$) to the applied voltage ($V_{REF}$), for the oscillation circuitry of the VCO module 206 based on the magnitude of the control voltage ($V_C$) and/or the reference voltage ($V_{REF}$). For example, when the control voltage ($V_C$) and/or reference voltage ($V_{REF}$) is greater than an upper threshold voltage value, the frequency control module 204 provides control signals that increases the oscillator gain (i.e., the ratio of the oscillation frequency ($f_{OUT}$) to the applied voltage ($V_{REF}$), such that the oscillation circuitry of the VCO module 206 generates the output signal with a greater oscillation frequency for the same control voltage ($V_C$) and/or reference voltage ($V_{REF}$). Conversely, when the control reference voltage ($V_C$) and/or reference voltage ($V_{REF}$) is less than a lower threshold voltage value, the frequency control module 204 provides control signals that decrease the ratio of the oscillation frequency ($f_{OUT}$) to the applied voltage ($V_{REF}$) such that the oscillation circuitry of the VCO module 206 generates the output signal with a lower oscillation frequency for the same control reference voltage ($V_C$) and/or reference voltage ($V_{REF}$).

As described in greater detail below, the oscillation frequency ($f_{OUT}$) of the output signal ($C_{OUT}$) is also influenced by the adjustment signals from the phase detection module 202, such that the oscillation frequency of the output signal ($C_{OUT}$) is adjusted by a first amount when the phase difference between the input reference signal ($C_{REF}$) and the output signal ($C_{OUT}$) is less than a threshold amount, and by a greater amount when the phase difference between the input reference signal ($C_{REF}$) and the output signal ($C_{OUT}$) is greater than the threshold amount. In an exemplary embodiment, the threshold amount corresponds to the phase difference between the output signal ($C_{OUT}$) and the respective leading/lagging feedback signal ($C_{OUT}^+$, $C_{OUT}^-$). In an exemplary embodiment, the phase detection module 202 generates a logical high value for a late adjustment signal when the phase of the output signal ($C_{OUT}$) lags the phase of the input reference signal ($C_{REF}$) but the phase of the leading feedback signal ($C_{OUT}^+$) does not lag the phase of the input reference signal ($C_{REF}$), and the phase detection module 202 generates a logical high value for a very late adjustment signal when the phase of the leading feedback signal ($C_{OUT}^+$) lags the phase of the input reference signal ($C_{REF}$). Conversely, the phase detection module 202 generates a logical high value for an early adjustment signal when the phase of the output signal ($C_{OUT}$) leads the phase of the input reference signal ($C_{REF}$) but the phase of the lagging feedback signal ($C_{OUT}^-$) does not lead the phase of the input reference signal ($C_{REF}$), and the phase detection module 202 generates a logical high value for a very early adjustment signal when the phase of the lagging feedback signal ($C_{OUT}^-$) leads the phase of the input reference signal ($C_{REF}$). The adjustment signals adjust the reference voltage ($V_{REF}$) for the oscillator circuitry of the VCO module 206 to produce a corresponding adjustment to the oscillation frequency of the output signal, as described in greater detail below.

It should be understood that FIG. 2 is a simplified representation of the digital PLL 200 for purposes of explanation and ease of description, and FIG. 2 is not intended to limit the subject matter in any way. For example, although not illustrated by FIG. 2, practical employments may include frequency dividers in to scale the frequencies of the input reference signal ($C_{REF}$), output signal ($C_{OUT}$), and/or feedback signals ($C_{OUT}^+$, $C_{OUT}^-$) in a conventional manner before providing the input reference signal ($C_{REF}$), output signal ($C_{OUT}$), and/or feedback signals ($C_{OUT}^+$, $C_{OUT}^-$) to the phase detection module 202 and/or the frequency control module 204 to satisfy the needs of a particular implementation.

Figure 3:
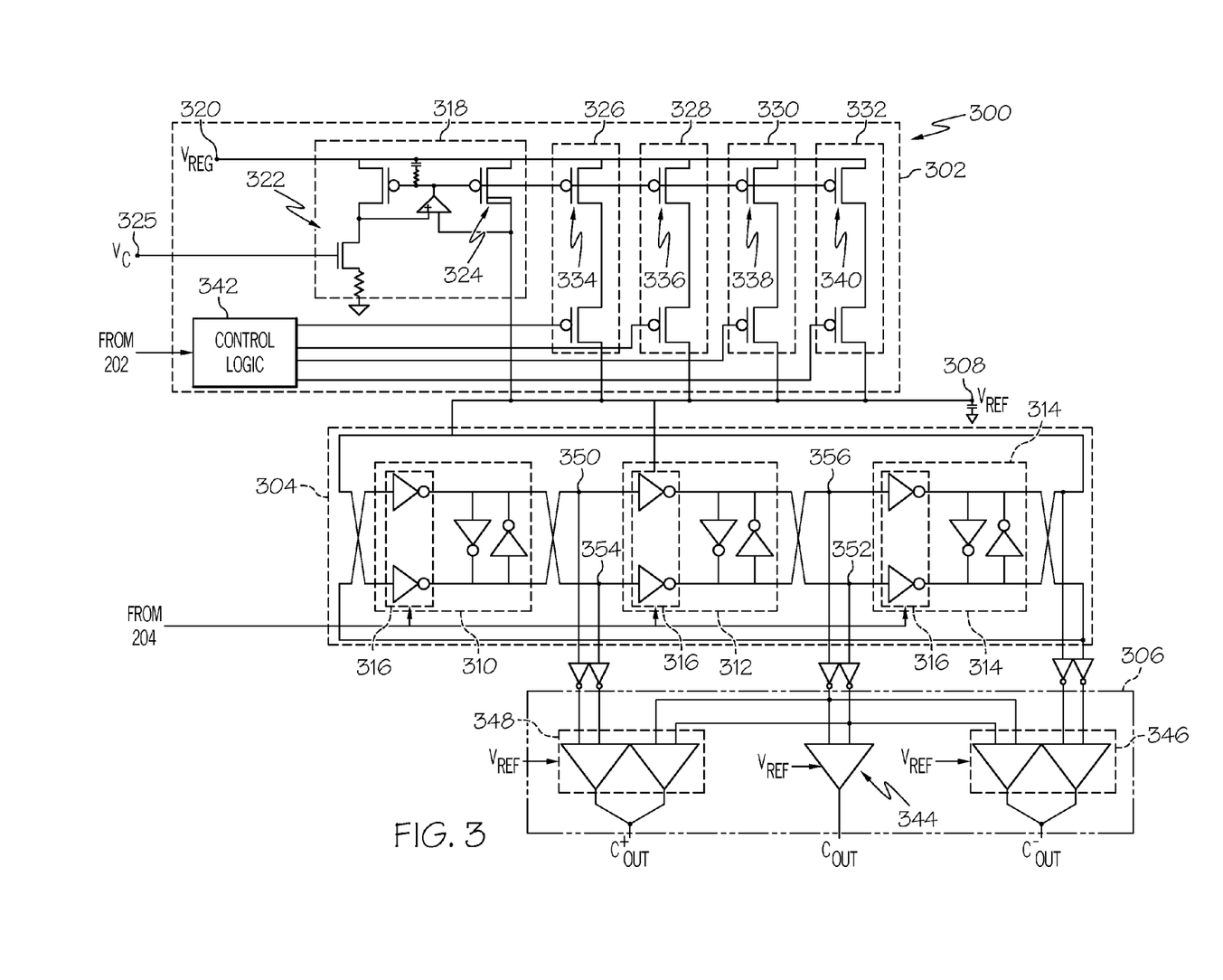
FIG. 3 is a schematic view of a voltage-controlled oscillator module suitable for use in the digital phase-locked loop of FIG. 2 in accordance with one embodiment.

FIG. 3 depicts an exemplary embodiment of a VCO module 300 suitable for use as the VCO module 206 in the digital PLL 200 of FIG. 2. The illustrated embodiment of the VCO module 300 includes, without limitation, voltage-to-current conversion circuitry 302, oscillator circuitry 304, and output generation circuitry 306. The voltage-to-current conversion circuitry 302 is coupled to the oscillator circuitry 304 and is configured to control or otherwise generate the oscillator reference voltage ($V_{REF}$) applied to the oscillator circuitry 304 at node 308 in a manner that is influenced by the control reference voltage ($V_C$) provided by the frequency control module 204. The oscillator circuitry 304 generates an oscillating signal with an oscillation frequency based on the reference voltage ($V_{REF}$), and the output generation circuitry 306 generates the output signal ($C_{OUT}$) based on the oscillating signal generated by the oscillator circuitry 304. In this manner, the oscillation frequency of the output signal ($C_{OUT}$) corresponds to the oscillation frequency of the oscillator circuitry 304, and accordingly, for convenience, the oscillation frequency of the oscillator circuitry 304 may alternatively be referred to herein as the output frequency $f_{OUT}$). The output generation circuitry 306 also generates the leading/lagging feedback signals ($C_{OUT}^+$, $C_{OUT}^-$) provided to the phase detection module 202 for generating adjustment signals to lock the phase of the output signal ($C_{OUT}$) with the phase of the input reference signal ($C_{REF}$), as described in greater detail below.

In an exemplary embodiment, the oscillator circuitry 304 includes adjustment circuitry adapted to allow the oscillator gain, that is, the ratio of the output frequency ($f_{OUT}$) to the applied voltage ($V_{REF}$), to be adjusted or otherwise modified in response to control signals from the frequency control module 204. In an exemplary embodiment, the oscillator circuitry 304 includes a first set of inverters (or main inverter circuitry) configured as a ring oscillator, wherein the adjustment circuitry comprises a second set of inverters that are configured to be selectively added electrically parallel to the first set of inverters in response to a logical high control signal asserted by the frequency control module 204 to increase the ratio of the output frequency ($f_{OUT}$) to the applied voltage ($V_{REF}$) (e.g., by decreasing the effective delay time of the delay stages of the ring oscillator). In an exemplary embodiment, the adjustment circuitry also includes one or more selectable capacitor pairs that are capable of being selectively added electrically parallel to the output of the set of inverters of the ring oscillator to decrease the ratio of the output frequency ($f_{OUT}$) to the applied voltage ($V_{REF}$) (e.g., by increasing the effective delay time of the delay stages of the ring oscillator).

In the illustrated embodiment, the oscillator circuitry 304 is realized as a differential ring oscillator that includes three delay stages (or delay cells) 310, 312, 314. It should be appreciated that although the subject matter may be described in the context of a differential implementation, in practice, the oscillator circuitry 304 may be implemented in a single-ended manner, and practical embodiments of the oscillator circuitry 304 may have any number of delay stages to satisfy the needs of a particular implementation. The outputs of a main delay stage 312 are used to generate the output signal ($C_{OUT}$), while the outputs of a leading delay stage 310 that precedes the main delay stage 312 are used to generate the leading feedback signal ($C_{OUT}^+$) and the outputs of a lagging delay stage 314 that follow the main delay stage 312 are used to generate the lagging feedback signal ($C_{OUT}^-$). The outputs of the leading delay stage 310 are inputs to the main delay stage 312, the outputs of main delay stage 312 are inputs to the lagging delay stage 314, and the outputs of the lagging delay stage 314 are inputs to the leading delay stage 310.

In an exemplary embodiment, each delay stage 310, 312, 314 includes adjustable inverter circuitry 316 that includes main inverter circuitry configured to generate the outputs of a respective delay stage 310, 312, 314 by inverting the outputs of the preceding delay stage 310, 312, 314. For example, the adjustable inverter circuitry 316 of the main delay stage 312 generates a first main output signal at node 352 by inverting the output signal from the leading delay stage 310 at node 350 and generates a second main output signal at node 356 by inverting the output signal from the leading delay stage 310 at node 354. The adjustable inverter circuitry 316 also includes adjustment circuitry coupled to the frequency control module 204 and configured to adjust the effective delay time (e.g., the rise time and/or fall time) of the outputs of the delay stages 310, 312, 314 with respect to transitions at the inputs of the delay stages 310, 312, 314, and thereby, adjust the ratio of the output frequency ($f_{OUT}$) to the applied voltage ($V_{REF}$), as described in greater detail below. As illustrated in FIG. 3, cross-coupling inverters may be provided across outputs of the delay stages 310, 312, 314 in a conventional manner.

The illustrated embodiment of voltage-to-current conversion circuitry 302 includes a first current mirror arrangement 318 coupled between a node 320 configured to receive a regulated or supply voltage ($V_{REG}$) and the oscillator circuitry 304 at node 308. The current mirror arrangement 318 functions as the primary current mirror or reference current mirror for the voltage-to-current conversion circuitry 302. A reference transistor 322 of the current mirror arrangement 318 has a gate terminal (or control terminal) coupled to a node 325 configured to receive the control voltage ($V_C$) from the frequency control module 204. The control voltage ($V_C$) turns on the reference transistor 322 and controls a reference current through reference transistor 322, which, in turn, controls the amount of current flowing through transistor 324 of the current mirror arrangement 318 to node 308. Increasing the control voltage ($V_C$) at node 325 increases the reference current through reference transistor 322, thereby increasing the current through transistor 324, which increases the reference voltage ($V_{REF}$) at node 308. In this manner, the control voltage ($V_C$) controls or otherwise influences the reference voltage ($V_{REF}$) that is applied to the oscillator circuitry 304 at node 308.

In the illustrated embodiment, the voltage-to-current conversion circuitry 302 includes additional stacked transistor arrangements 326, 328, 330, 332 coupled between node 320 and node 308. Each stacked transistor arrangement 326, 328, 330, 332 is configured to mirror the reference current through the reference transistor 322. In this regard, each stacked transistor arrangement 326, 328, 330, 332 functions as a secondary current mirror that may be selectively enabled or otherwise turned on or off to increase or decrease the amount of current flowing to node 308, and thereby control the reference voltage ($V_{REF}$) at node 308. The upper transistors 334, 336, 338, 340 of the secondary current mirrors 326, 328, 330, 332 are independently weighted and/or ratioed (or sized) with respect to the transistor 324 of the primary current mirror 318 to allow a respective secondary current mirror 326, 328, 330, 332 to achieve a desired amount of adjustment to the reference voltage ($V_{REF}$) at node 308. In this manner, the amount by which the voltage at node 308 is adjusted by current mirrors 326, 328, 330, 332 is process, voltage, and temperature (PVT) compensated because the amount of current through the current mirrors 326, 328, 330, 332 is controlled by the reference transistor 322, and reference current through the reference transistor 322 is PVT compensated by the control loop operating the digital PLL 200 to achieve a desired operating frequency. In this manner, the change in the output frequency ($f_{OUT}$) of the VCO module 300 in response to enabling/disabling an individual current mirror 326, 328, 330, and 332 is a fixed percentage of the nominal operating frequency of the VCO module 300.

In an exemplary embodiment, the voltage-to-current conversion circuitry 302 also includes control logic 342 coupled to the phase detection module 202 and configured to control which of the secondary current mirrors 326, 328, 330, 332 are concurrently turned on to set the reference voltage ($V_{REF}$) at node 308 based on adjustment signals provided by the phase detection module 202. In an exemplary embodiment, when the adjustment signals are all logical low (e.g., during initial calibration of the PLL 200 and/or VCO module 206, 300 or when the output signal and the input reference signal are locked), the control logic 342 concurrently turns on or otherwise enables two of the secondary current mirrors 326, 328 (e.g., by turning on the lower transistors between transistors 334, 336 and node 308) and turns off or otherwise disables the remaining two secondary current mirrors 330, 332 (e.g., by turning off the lower transistors between transistors 338, 340 and node 308) to set the reference voltage ($V_{REF}$) at node 308. In response to a logical high value for late adjustment signal and logical low values for the remaining adjustment signals, the control logic 342 concurrently turns on three of the secondary current mirrors 326, 328, 330 while maintaining the remaining secondary current mirror 332 in an off state to increase the reference voltage ($V_{REF}$) applied to the oscillator circuitry 304 at node 308, and thereby increase the output frequency by a first fixed amount (e.g., 1% increase in the output frequency). In response to a logical high value for the very late adjustment signal, the control logic 342 concurrently turns on all four secondary current mirrors 326, 328, 330, 332 to further increase the reference voltage ($V_{REF}$) at node 308, and thereby increase the output frequency by a greater fixed amount (e.g., a 2% increase in the output frequency). In response to a logical high value for the early adjustment signal, the control logic 342 turns on only one secondary current mirror 326 and turns off the remaining secondary current mirrors 328, 330, 332 to decrease the reference voltage ($V_{REF}$) applied to the oscillator circuitry 304 at node 308, and thereby decrease the output frequency by the first fixed amount (e.g., a 1% reduction in the output frequency). In response to a logical high value for the very early adjustment signal, the control logic 342 turns off all of the secondary current mirrors 326, 328, 330, 332 to further decrease the reference voltage ($V_{REF}$) at node 308, and thereby decrease the output frequency by the second fixed amount (e.g., a 2% reduction in the output frequency). As described above, the transistors 334, 336, 338, 340 of the secondary current mirrors 326, 328, 330, 332 are sized (or ratioed) with respect to the transistor 324 of the primary current mirror 318 and with respect to the transistors 334, 336, 338, 340 of the other secondary current mirrors 326, 328, 330, 332 such that each current mirror 326, 328, 330, 332 achieves a desired amount of adjustment to the reference voltage ($V_{REF}$) at node 308 when enabled, and thereby, a desired amount of adjustment to the output frequency ($f_{OUT}$) of the oscillator circuitry 304. In some practical embodiments, the relative strength of the transistors 334, 336, 338, 340 may be programmable and/or adjustable to add further granularity to the adjustment of the output frequency ($f_{OUT}$).

In an exemplary embodiment, the output generation circuitry 306 includes voltage level translation circuitry 344 (e.g., a level shifter) configured to generate the output signal ($C_{OUT}$) based on the buffered outputs of the main delay stage 312 of the ring oscillator 304. The voltage level translation circuitry 344 performs voltage level translation to convert the buffered outputs of the main delay stage 312 from the oscillator reference voltage ($V_{REF}$) to the appropriate logic level to obtain the digital output signal ($C_{OUT}$). In a similar manner, the output generation circuitry 306 also includes voltage level translation circuitry 346 (or level shifters) configured to generate the lagging version of output signal ($C_{OUT}^-$) based on the buffered outputs of the lagging delay stage 314 and the buffered outputs of the main delay stage 312. In this regard, the voltage level translation circuitry also interpolates the outputs of the lagging delay stage 314 and the main delay stage 312 to obtain a lagging feedback signal ($C_{OUT}^-$) having a desired phase difference relative to the output signal ($C_{OUT}$). Similarly, the output generation circuitry 306 includes voltage level translation circuitry 348 configured to generate the leading version of output signal ($C_{OUT}^+$) based on the buffered outputs of the leading delay stage 310 and the buffered outputs of the main delay stage 312 by performing voltage level translation and interpolating the outputs of the delay stages 310, 312 to obtain a leading feedback signal ($C_{OUT}^+$) having a desired phase difference relative to the output signal ($C_{OUT}$).

As described above, the phase difference between the leading/lagging feedback signals and the output signal corresponds to a threshold amount for adjusting the reference voltage ($V_{REF}$) of the oscillator 304. In an exemplary embodiment, the phase difference between the leading feedback signal and the output signal is substantially equal to (within realistic and/or practical operating tolerances) the phase difference between the lagging feedback signal and the output signal. The phase difference between the leading/lagging feedback signals ($C_{OUT}^+$, $C_{OUT}^-$) is a fraction of the period of the output signal ($C_{OUT}$), that is, the phase difference between the leading/lagging feedback signals and the output signal (e.g., the threshold amount) is dependent on the period (or the inverse of the frequency) of the output signal ($C_{OUT}$). For example, in accordance with one embodiment, the threshold amount is about one sixth the period of the full-rate clock, and thus, when the output signal ($C_{OUT}$) corresponds to a full-rate clock signal, the threshold amount is about one sixth the period of the full-rate clock ($C_{OUT}$). It should be appreciated that the threshold amount is not intended to be limited amount, and in practice, the threshold amount may be chosen to be another ratio of the period of the output signal (e.g., one third, one fourth, one twelfth) to satisfy the needs of a particular embodiment. It should be noted that the phase differences between the leading/lagging feedback signals and the output signal (e.g., the threshold amount) are process, voltage, and temperature (PVT) compensated because any PVT variations in the oscillator circuitry 304 are reflected by the output signal and the leading/lagging feedback signals in a corresponding manner.

Figure 4:
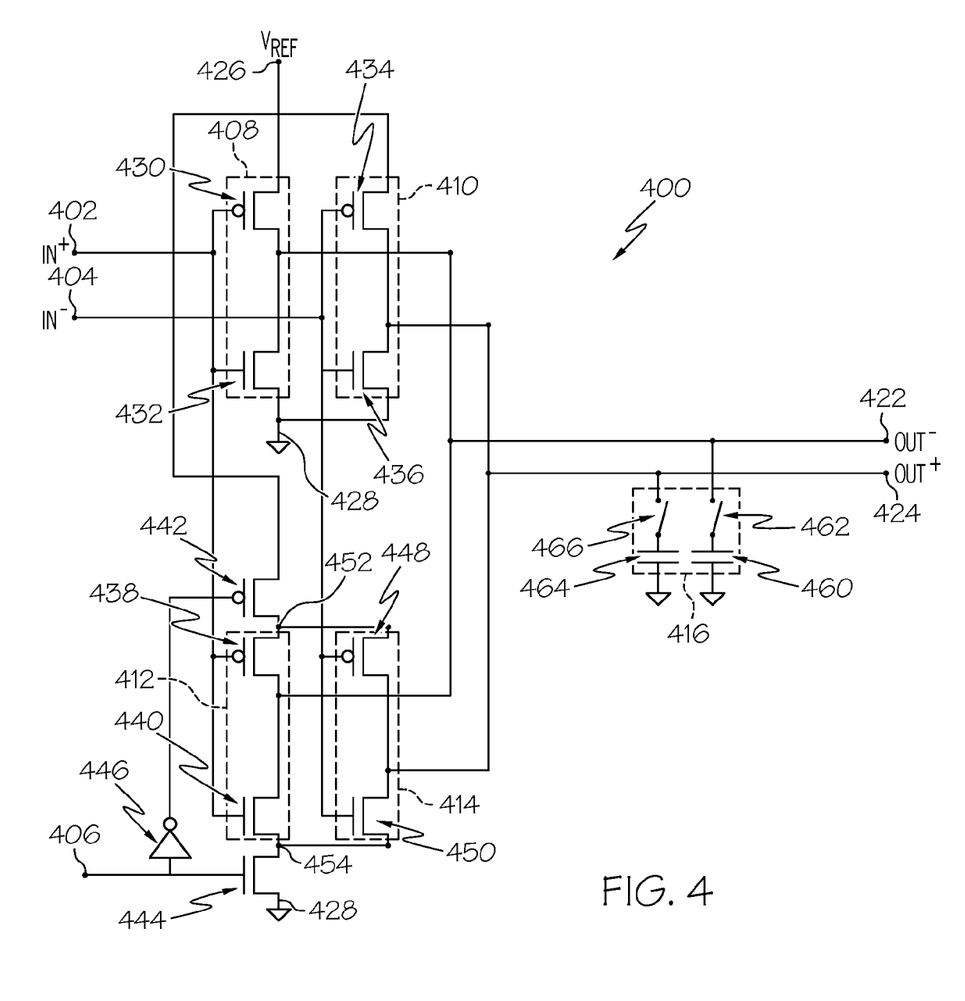
FIG. 4 is a schematic view of adjustable inverter circuitry suitable for use in the voltage-controlled oscillator module of FIG. 3 in accordance with one embodiment.

FIG. 4 depicts an exemplary embodiment of adjustable inverter circuitry 400 suitable for use as adjustable inverter circuitry 316 in a delay stage 310, 312, 314 of the oscillator circuitry 304 of FIG. 3. The illustrated embodiment of the adjustable inverter circuitry 400 includes, without limitation, differential input nodes 402, 404, a control input node 406, first main inverter circuitry 408, second main inverter circuitry 410, first selectable inverter circuitry 412, second selectable inverter circuitry 414, at least one selectable capacitor pair 416, and differential output nodes 422, 424. In an exemplary embodiment, a reference voltage node 426 is connected to node 308 to receive the reference voltage ($V_{REF}$) for the oscillator circuitry 304, and a ground reference node 428 is connected to the ground reference voltage for the oscillator circuitry 304 and/or VCO module 300. The main inverter circuitry 408, 410 is configured between node 426 and node 428 such that the delay time (e.g., rise time and/or fall time) of the main inverter circuitry 408, 410 (e.g., the rise/fall time of the output signals at output nodes 422, 424 relative to transitions of the input signals at differential input nodes 402, 404) is influenced or otherwise controlled by the applied reference voltage ($V_{REF}$), and thus, adjusting the reference voltage ($V_{REF}$) at node 308, 426 produces a corresponding change in the output frequency of the oscillator circuitry 304. For example, in the illustrated embodiment, increasing the voltage at the reference voltage node 426 decreases the delay time of the main inverter circuitry 408, 410 and thereby increases the oscillation frequency of the ring oscillator 304, while decreasing the voltage at the reference voltage node 426 increases the delay time of the main inverter circuitry 408, 410 and decreases the oscillation frequency. The control input node 406 is coupled to the frequency control module 204 and receives a logical high control signal indicative of a desire to decrease the delay time of the adjustable inverter circuitry 400 with respect to the applied voltage ($V_{REF}$), and thereby, increase the ratio of the output frequency ($f_{OUT}$) to the applied voltage ($V_{REF}$), as described in greater detail below.

The first main inverter circuitry 408 is coupled between differential input node 402 and differential output node 422 and generates an inverted version of the signal at differential input node 402 at output nodes 422. In this regard, when the input signal at differential input node 402 corresponds to a positive (or true) differential input signal (IN$^+$), the output signal at output nodes 422 corresponds to a negative (or complementary) differential output signal (OUT$^-$) that represents a logically inverted version of the input signal at node 402. In an exemplary embodiment, the first main inverter circuitry 408 is realized as a complementary metal-oxide-semiconductor (CMOS) inverter including a p-type transistor 430 and an n-type transistor 432. The source terminal of the p-type transistor 430 is coupled to the reference voltage node 426, the control terminal (or gate terminal) of the p-type transistor 430 is coupled to the differential input node 402, and the drain terminal of the p-type transistor 430 is coupled to the output node 422. The drain terminal of the n-type transistor 432 is coupled to the output node 422, the gate terminal of the n-type transistor 432 is coupled to the differential input node 402, and the source terminal of the n-type transistor 432 is coupled to the ground reference node 428. In this manner, a logical low voltage signal (or logic '0') at the differential input node 402 turns on the p-type transistor 430 and turns off the n-type transistor 432 resulting in a logical high voltage signal (or logic '1') at the output node 422, and a logical high voltage signal (or logic '1') at the differential input node 402 turns off the p-type transistor 430 and turns on the n-type transistor 432 resulting in a logical low voltage signal (or logic '0') at the output node 422. In a similar manner, the second main inverter circuitry 410 includes a CMOS inverter (including p-type transistor 434 and n-type transistor 436) that is coupled between differential input node 404 and differential output node 424 that generates an inverted version of the signal at differential input node 404 at node 424. In this regard, when the input signal at input node 404 corresponds to a negative (or complementary) differential input signal (IN$^-$), the output signal at output nodes 422 corresponds to a positive (or true) differential output signal (OUT$^+$) that represents a logically inverted version of the input signal at node 404.

In an exemplary embodiment, the first selectable inverter circuitry 412 is realized as a CMOS inverter coupled between the differential input node 402 and differential output node 422 for the first main inverter 408, and the second selectable inverter circuitry 414 is realized as a CMOS inverter coupled between the differential input node 404 and differential output node 424 for the second main inverter 410. The adjustable inverter circuitry 400 includes a pair of switching elements 442, 444 such that the selectable inverters 412, 414 may be selectively added electrically parallel to the main inverters 408, 410 between node 426 and node 428. In the illustrated embodiment, the switching elements 442, 444 are realized as transistors, wherein the first transistor 442 selectively couples node 452 to node 426 in response to a logical high control signal asserted at control input node 406, and the second transistor 444 selectively couples node 454 to node 428 in response to the logical high control signal asserted at control input node 406, as described in greater detail below.

In the illustrated embodiment, the first selectable inverter circuitry 412 includes a p-type transistor 438 and an n-type transistor 440 that are selectively added electrically parallel to the inverter circuitry 408 between the node 426 and node 428 in response to a logical high voltage signal at the control input node 406. In the illustrated embodiment, the source terminal of the p-type transistor 438 is coupled to drain terminal of a p-type transistor 442 and the source terminal of the n-type transistor 440 is coupled to the drain terminal of an n-type transistor 444, wherein the source terminal of the p-type transistor 442 is coupled to node 426 and the source terminal of the n-type transistor 444 is coupled to the ground reference node 428. The gate terminal of the n-type transistor 444 is coupled to the control input node 406, and an inverter gate 446 is coupled between the control input node 406 and the gate terminal of the p-type transistor 442. In this manner, a logical high voltage signal at the control input node 406 turns on the transistors 442, 444, thereby enabling conduction of current by the transistors 438, 440 of the inverter circuitry 412. It will be appreciated that the voltage at node 452 is substantially equal to the reference voltage at node 426 when transistor 442 is turned on and the voltage at node 454 is substantially equal to the ground voltage at node 428 when transistor 444 is turned on. In a similar manner as described above in the context of the first main inverter circuitry 408, the gate terminal of the p-type transistor 438 is coupled to differential input node 402, the drain terminal of the p-type transistor 438 is coupled to output nodes 422, the drain terminal of the n-type transistor 440 is coupled to output nodes 422, and the gate terminal of the n-type transistor 440 is coupled to differential input node 402 to generate or otherwise provide a logically inverted version of the signal at differential input node 402 at output nodes 422. Thus, in response to a logically high voltage at control input node 406, the inverter circuitry 412 logically inverts the input signal at differential input node 402 in concert with the first main inverter circuitry 408, such that the effective delay time (e.g., the rise time and/or fall time) of the output signal at output nodes 422 relative to the transition of the input signal at differential input node 402 is reduced when the inverter circuitry 412 is enabled.

In a similar manner, the second selectable inverter circuitry 414 includes a p-type transistor 448 and an n-type transistor 450 that are selectively added electrically parallel to the second main inverter circuitry 410 between the node 426 and node 428 in response to a logical high voltage signal at the control input node 406. The source terminal of the p-type transistor 448 is coupled to the source terminal of p-type transistor 438 and/or the drain terminal of p-type transistor 442 at node 452, and the source terminal of the n-type transistor 450 is coupled to the source terminal of n-type transistor 440 and/or drain terminal of transistor 444 at node 454. In a similar manner as described in the context of circuitry 410, the gate terminal of the p-type transistor 448 is coupled to differential input node 404, the drain terminal of the p-type transistor 448 is coupled to node 424, the drain terminal of the n-type transistor 450 is coupled to node 424, and the gate terminal of the n-type transistor 450 is coupled to differential input node 404 to generate or otherwise provide a logically inverted version of the signal at differential input node 404 at node 424. Thus, in response to a logically high voltage at control input node 406, the inverter circuitry 414 logically inverts the input signal at differential input node 404 in concert with inverter circuitry 410, such that the effective delay time (e.g., the rise time and/or fall time) of the output signal at node 424 relative to the transition of the input signal at differential input node 404 is reduced when the inverter circuitry 414 is enabled.

In an exemplary embodiment, the selectable capacitor pair 416 includes a first switched capacitor configured between output node 422 and node 428 and a second switched capacitor configured between node 424 and node 428. In this regard, the selectable capacitor pair 416 includes a first capacitor 460 coupled to node 428, a first switching element 462 coupled between the first capacitor 460 and output nodes 422, a second capacitor 464 coupled to node 428, and a second switching element 466 coupled between the second capacitor 464 and node 424. In an exemplary embodiment, the capacitors of the capacitor pair 416 are selectively coupled to the output nodes 422, 424 in concert by the frequency control module 204, as described in greater detail below. It will be appreciated that when the capacitors of the capacitor pair 416 are coupled between the output nodes 422, 424 and the node 428, the rise time and/or fall time of the output signals at output nodes 422, 424 relative to transitions of the input signals at differential input node 402, 404 increases, thereby decreasing the ratio of the output frequency ($f_{OUT}$) to the applied voltage ($V_{REF}$), as described in greater detail below.

It should be understood that FIG. 4 is a simplified representation of adjustable inverter circuitry 400 for purposes of explanation and ease of description, and FIG. 4 is not intended to limit the subject matter in any way. Thus, although FIG. 4 depicts direct electrical connections between circuit elements and/or terminals, alternative embodiments may employ intervening circuit elements and/or components while functioning in a substantially similar manner. Furthermore, although FIG. 4 depicts a single selectable capacitor pair 416, additional capacitor pairs may be coupled to the output nodes 422, 424 of the adjustable inverter circuitry 400 to accommodate greater increases to the rise time and/or fall time of the output signals at output nodes 422, 424 relative to transitions of the input signals at differential input nodes 402, 404 (or greater decreases of the ratio of output frequency ($f_{OUT}$) to the applied voltage ($V_{REF}$). Similarly, practical embodiments of the adjustable inverter circuitry 400 may include additional instances of selectable inverter circuitry 412, 414 configured to be selectively added electrically parallel to the main inverter circuitry 408, 410 and independently of the other instances of selectable inverter circuitry 412, 414 (e.g., in response to a second control signal at a second control node) to achieve greater decreases to the rise/fall time of the output signals at output nodes 422, 424 relative to transitions of the input signals at differential input nodes 402, 404 (or greater increases of the ratio of output frequency ($f_{OUT}$) to the applied voltage ($V_{REF}$)).

Referring now to FIGS. 2-4, in an exemplary embodiment, the adjustable inverter circuitry 400 is replicated to provide the adjustable inverter circuitry 316 for each delay stage 310, 312, 314. In this regard, the reference voltage node 426 of each instance of the adjustable inverter circuitry 316 is connected to node 308. Additionally, nodes 452 of the various instances of adjustable inverter circuitry 400 are interconnected, and nodes 454 of the various instances of adjustable inverter circuitry 400 are interconnected, such that transistors 442, 444 may not need to be replicated for each delay stage 310, 312, 314. Similarly, the control input nodes 406 of each instance of adjustable inverter circuitry 400 are interconnected such that the rise time and/or fall time of each instance of adjustable inverter circuitry 316 are substantially the same across the oscillator 304. The differential input nodes 402, 404 are coupled to the differential output nodes 422, 424 of the adjustable inverter circuitry 316, 400 of a preceding delay stage 310, 312, 314 or otherwise configured to receive the differential outputs from a preceding delay stage 310, 312, 314. For example, the positive differential input node 402 of the adjustable inverter circuitry 316, 400 of the main delay stage 312 is coupled to the negative differential output node 422 of the adjustable inverter circuitry 316, 400 of the leading delay stage 310 at node 350, and the negative differential output node 422 of the adjustable inverter circuitry 316, 400 of the main delay stage 312 is coupled to the positive differential input node 402 of the adjustable inverter circuitry 316, 400 of the lagging delay stage 314 at node 352.

Referring now to FIGS. 2-4, in an exemplary embodiment, when the VCO module 300 including adjustable inverter circuitry 400 is used in the PLL 200 of FIG. 2 as VCO module 206, the reference transistor 322 of the primary current mirror 318 is configured to receive the control voltage ($V_C$) from the frequency control module 204 at node 325 which sets the reference voltage at node 308 such that the oscillation frequency of the ring oscillator 304 is within a calibrated range of the frequency of the input reference signal ($C_{REF}$) (e.g., within 2000 parts per million), as described above. The outputs of the output generation circuitry 306 are coupled to or otherwise fed back to the inputs of the phase detection module 202. It should be noted that although not illustrated by FIG. 2, the outputs of the output generation circuitry 306 may be fed through frequency dividers before being fed to the phase detection module 202 in a conventional manner, as described above. The control logic 342 is coupled to the output of the phase detection module 202 and determines how many of the secondary current mirrors 326, 328, 330, 332 should be turned on to achieve a desired adjustment to the reference voltage at node 308 to produce a corresponding adjustment to the oscillation frequency of the oscillator circuitry 304. In an exemplary embodiment, the frequency control module 204 is coupled to the control input node 406 and the switches 462, 466 of the selectable capacitor pair 416 of each instance of the adjustable inverter circuitry 316, 400, and adjusts the ratio of output frequency ($f_{OUT}$) to applied voltage ($V_{REF}$) for the oscillator circuitry 304 and/or VCO module 206, 300, as described in greater detail below.

Figure 5:
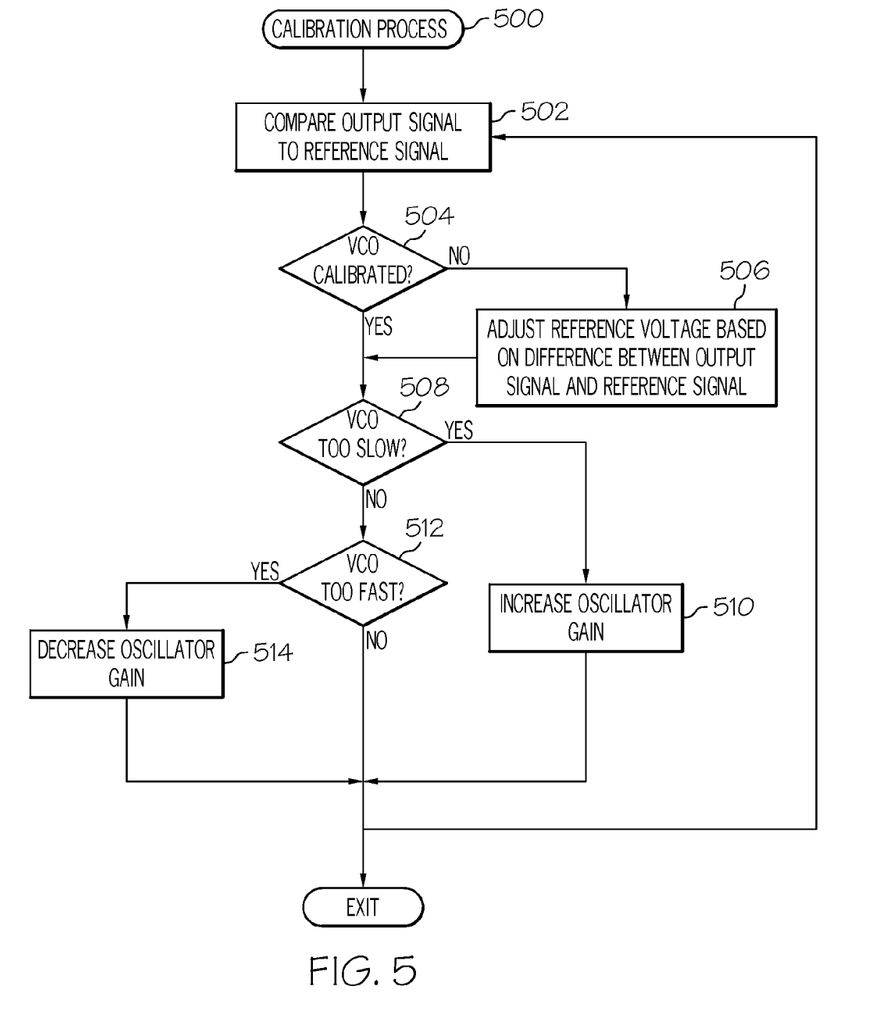
FIG. 5 is a calibration process suitable for use with the voltage-controlled oscillator module of FIG. 3 when used in the phase-locked loop of FIG. 2 in accordance with one or more embodiments.

Referring now to FIG. 5, in an exemplary embodiment, the digital PLL 200 of FIG. 2 may be configured to perform a VCO calibration process 500 and additional tasks, functions, and operations described below. The various tasks may be performed by software, hardware, firmware, or any combination thereof. For illustrative purposes, the following description may refer to elements mentioned above in connection with FIGS. 1-4. In practice, the tasks, functions, and operations may be performed by different elements of the described system, such as the processing system 122, the phase detection module 202, the frequency control module 204, the VCO module 206, 300, the voltage-to-current conversion circuitry 302, the oscillator circuitry 304, the output generation circuitry 306, the control logic 342. It should be appreciated that any number of additional or alternative tasks may be included, and may be incorporated into a more comprehensive procedure or process having additional functionality not described in detail herein.

Referring now to FIG. 5, and with continued reference to FIGS. 1-4, the VCO calibration process 500 may be performed to calibrate the VCO module 206, 300 upon initialization of the PLL 200 or in response to a change in the frequency of the input reference signal ($C_{REF}$). In an exemplary embodiment, the VCO calibration process 500 initializes by providing the lowest allowable control voltage ($V_C$)) to the VCO module 206, 300. In this regard, the frequency control module 204 provides a control voltage ($V_C$)) corresponding to a lower threshold voltage value, for example, by setting the control voltage ($V_C$)) to a voltage that is equal to (or less than) the lower threshold voltage value for the control voltage ($V_C$). The VCO calibration process 500 continues by comparing the output signal generated by the VCO module to a reference signal and determining whether the output signal is calibrated with a desired level of accuracy (tasks 502, 504). In this regard, in accordance with one embodiment, the processing system 122 provides a target output frequency (e.g., the anticipated frequency of the transmit clock signal) for the digital PLL 118, 200 to the frequency control module 204. The frequency control module 204 receives the target output frequency and a reference signal having a known frequency (e.g., the output of a local oscillator implemented by computing module 104) and implements a counter to determine whether the output signal from the VCO module 206, 300 is within a desired range of the targeted frequency (e.g., within 2000 parts per million or within 0.2% of the target output frequency). Based on the known frequency of the reference signal and the target frequency, the frequency control module 204 may determine or otherwise calculate an expected number of oscillations for the output signal from the VCO module 206, 300 that represents the expected number of oscillations of the output signal that would be observed if the VCO module 206, 300 were operating at the targeted frequency over a fixed number of oscillations of the known reference signal. The frequency control module 204 counts the number of oscillations of the output signal from the VCO module 206, 300 over the fixed number of oscillations of the reference signal, and determines that the VCO module 206, 300 is calibrated when the difference between the counted number of oscillations for the VCO module 206, 300 and the expected number of oscillations is within the specified range (e.g., within 0.2%) of the expected number of oscillations. For example, if the counted number of oscillations is $N_C$, the expected number of oscillations is $N_X$, and the desired level of accuracy is 0.2%, then the frequency control module 204 determines or otherwise identifies the VCO module 206, 300 as being calibrated when $$\frac{|N_X - N_C|}{N_X} \leq 0.02.$$

In response to determining the output signal of the VCO module is not calibrated with the desired level of accuracy, the VCO calibration process 500 continues by adjusting a reference voltage for the VCO module based on the relationship between the output signal and the reference signal (task 506). In this regard, the frequency control module 204 adjusts the control voltage ($V_C$) provided to the VCO module 206, 300 based on the magnitude of the difference between the counted number of oscillations for the output signal and the expected number of oscillations for the output signal. When the counted number of oscillations is less than the expected number of oscillations, the frequency control module 204 increases the control voltage ($V_C$) by an amount determined based upon the magnitude of the difference between the counted number of oscillations and the expected number of oscillations to increase the oscillation frequency of the output signal. For example, when the difference between the counted number of oscillations and the expected number of oscillations is greater than the desired level of accuracy but less than a first threshold value (e.g., $N_X - N_C < N_1$), the frequency control module 204 may increase the control voltage ($V_C$) by a first voltage amount ($V_1$). When the difference between the counted number of oscillations and the expected number of oscillations is greater than the first threshold value but less than a second threshold value (e.g., $N_1 < N_X - N_C < N_2$), the frequency control module 204 may increase the control voltage ($V_C$) by a second voltage amount ($V_2$) that is greater than the first voltage amount ($V_2 > V_1$), when the difference between the counted number of oscillations and the expected number of oscillations is greater than the second threshold value (e.g., $N_X - N_C > N_2$), the frequency control module 204 may increase the control voltage ($V_C$) by a third voltage amount ($V_3$) that is greater than the second voltage amount ($V_3 > V_2$), and so on. By proportionally increasing the control voltage ($V_C$) based on the relative magnitude of the frequency error (e.g., $N_X - N_C$) reduces calibration time while avoiding undesirable overshoot of the target output frequency. As described above in the context of FIG. 3, increasing the control voltage ($V_C$) produces a corresponding increase to the reference voltage ($V_{REF}$) applied to the oscillator circuitry 304, thereby increasing the oscillation frequency of the output signal ($C_{OUT}$). Conversely, if the counted number of oscillations is greater than the expected number of oscillations, the frequency control module 204 may decrease the control voltage ($V_C$) in a similar manner by an amount determined based upon the magnitude of the difference between the counted number of oscillations and the expected number of oscillations to thereby decrease the oscillation frequency of the output signal.

In an exemplary embodiment, the VCO calibration process 500 continues by determining whether the VCO within the VCO module is operating too slow (task 508). In this regard, when the main inverter circuitry 408, 410 in the delay stages 310, 312, 314 of the oscillator circuitry 304 is operating too slowly (e.g., due to PVT variations), the oscillator circuitry 304 requires a relatively higher applied reference voltage ($V_{REF}$) at node 308 to achieve a targeted output frequency. When the reference voltage ($V_{REF}$) increases, the voltage difference between node 320 and node 308 decreases, thereby decreasing the voltage across the current mirrors 318, 326, 328, 330, 332. As a result, when the difference between the reference voltage ($V_{REF}$) and the regulated voltage ($V_{REG}$) becomes too small, the amount of adjustment to the oscillation frequency of the output signal ($C_{OUT}$) provided by current mirrors 326, 328, 330, 332 is changed, thereby impacting the operation of the digital PLL 200. In accordance with one or more embodiments, the frequency control module 204 determines or otherwise identifies the VCO module 206, 300 is operating too slowly when the reference voltage at node 308 exceeds a threshold amount. For example, in accordance with one embodiment, the threshold amount is chosen to be equal to the regulated voltage at node 320 minus 160 milli-Volts (mV) to ensure a voltage drop of 160 mV across the current mirrors of the voltage-to-current conversion circuitry 302. The threshold amount is chosen to maintain or otherwise provide a desired voltage difference between the reference voltage at node 308 and the regulated voltage at node 320 that ensures the current mirrors 326, 328, 330, 332 are capable of providing their intended amount of adjustment to the reference voltage at node 308 (i.e., their intended amount of adjustment to the frequency of the output signal).

In some embodiments, the frequency control module 204 may implement a high-resolution digital-to-analog converter (DAC) configured to provide the control voltage ($V_C$) to the VCO module 206, 300 based on a digital input code. When the main inverter circuitry 408, 410 in the delay stages 310, 312, 314 of the oscillator circuitry 304 is operating too slowly, the control voltage ($V_C$) must be increased to provide a greater reference voltage ($V_{REF}$) at node 308, as described above. As result, the digital input code to the DAC may reach its full scale value, thereby preventing the frequency control module 204 from further increasing the control voltage ($V_C$) (and thereby the output frequency of the VCO module 206, 300) to calibrate the output signal of the VCO module 206, 300 within the prescribed range of the input reference signal (e.g., within 2000 parts per million or 0.2% of the frequency of the input reference signal). Accordingly, the frequency control module 204 may determine or otherwise identify that the VCO module 206, 300 is operating too slow when the digital code being input to the DAC is within a threshold amount of its full scale input value, or in other words, when the control voltage ($V_C$) at the output of the DAC exceeds an upper threshold voltage value corresponding to the full scale voltage output (or a voltage output that is near the full scale voltage output) of the DAC.

In response to determining the VCO module is operating too slowly, the VCO calibration process 500 continues by increasing the oscillator gain for the oscillator of the VCO module (task 510). In this regard, the frequency control module 204 increases the ratio of the output frequency of the VCO module 206, 300 to the reference voltage ($V_{REF}$) and/or control voltage ($V_C$). In response to identifying the reference voltage ($V_{REF}$) exceeds a threshold amount (e.g., the regulated voltage at node 320 minus a desired voltage difference from node 320 to node 308), the frequency control module 204 asserts or otherwise provides a logical high state (or logical high voltage) for the control signal at control input node 406 to add or otherwise enable the selectable inverter circuitry 412, 414 electrically parallel to the main inverter circuitry 408, 410 in the delay stages 310, 312, 314 of the oscillator circuitry 304. Similarly, in some embodiments, in response to identifying that the digital code being input to the DAC of the frequency control module 204 is within a threshold amount of its full scale input value or that the control voltage ($V_C$) meets or exceeds an upper threshold voltage value corresponding to the full scale voltage output of the DAC, the frequency control module 204 may provide a logical high control signal at control input node 406 to add or otherwise enable the selectable inverter circuitry 412, 414 electrically parallel to the main inverter circuitry 408, 410 in the delay stages 310, 312, 314 of the oscillator circuitry 304. As a result, the delay time (e.g., the rise time and/or fall time) of the adjustable inverter circuitry 316, 400 of the delay stages 310, 312, 314 is effectively reduced, thereby increasing ratio of the output frequency ($f_{OUT}$) of the oscillator circuitry 304 to the applied reference voltage ($V_{REF}$) at node 308. Thus, a given reference voltage ($V_{REF}$) and/or control voltage ($V_C$) produces an output signal with a greater output frequency ($f_{OUT}$) when the selectable inverter circuitry 412, 414 is enabled, allowing the reference voltage ($V_{REF}$) and/or control voltage ($V_C$) to be reduced to achieve the targeted output frequency. As a result, the functionality of current mirrors 326, 328, 330, 332 is not impaired and the DAC of the frequency control module 204 may be capable of further increasing the control voltage ($V_C$) (and thereby the reference voltage ($V_{REF}$) and output frequency of the VCO module 206, 300) as needed.

In response to determining the VCO within the VCO module is not operating too slow, in an exemplary embodiment, the VCO calibration process 500 continues by determining whether the VCO within the VCO module is operating too fast (task 512). In this regard, when the main inverter circuitry 408, 410 in the delay stages 310, 312, 314 of the oscillator circuitry 304 is operating too fast (e.g., due to PVT variations), the oscillator circuitry 304 requires a relatively lower applied reference voltage ($V_{REF}$) at node 308 to achieve a targeted output frequency. When the reference voltage ($V_{REF}$) becomes too low, the ability of the voltage level translation circuitry 344, 346, 348 to accurately translate the outputs of the delay stages 310, 312, 314 to the appropriate logic levels to generate the digital output signal ($C_{OUT}$) and feedback signals ($C_{OUT}^+$, $C_{OUT}^-$) is impaired. In accordance with one embodiment, the frequency control module 204 determines or otherwise identifies the VCO module 206, 300 is operating too fast when the reference voltage ($V_{REF}$) at node 308 is less than a threshold amount (e.g., 400 milliVolts) that is chosen to ensure that the voltage level translation circuitry 344, 346, 348 maintains proper functionality. Additionally, when the main inverter circuitry 408, 410 in the delay stages 310, 312, 314 of the oscillator circuitry 304 is operating too fast, the control voltage ($V_C$) must be decreased to provide a relatively lower reference voltage ($V_{REF}$) at node 308 to achieve a targeted output frequency. As result, the DAC may reach its lowest value, and preventing the frequency control module 204 from being able to further decrease the control voltage ($V_C$) (and thereby decrease the output frequency of the VCO module 206, 300) if necessary to bring the output signal of the VCO module 206, 300 within the prescribed range of the input reference signal (e.g., within 2000 parts per million or 0.2% of the frequency of the input reference signal). Accordingly, in some embodiments, the frequency control module 204 may also determine or otherwise identify the VCO module 206, 300 is operating too fast when the digital code being input to the DAC is less than a threshold value corresponding to the lower threshold voltage value for the control voltage ($V_C$), or in other words, when the control voltage ($V_C$) at the output of the DAC is less than the lower threshold voltage for the control voltage ($V_C$).

In response to determining the VCO module is operating too fast, the VCO calibration process 500 continues by decreasing the ratio of the output frequency to the applied reference voltage for the VCO module (task 514). In this regard, when the reference voltage ($V_{REF}$) at node 308 is less than a threshold amount (e.g., 400 milliVolts), the frequency control module 204 enables the selectable capacitor pair 416 across the differential output nodes 422, 424 of the main inverter circuitry 408, 410 in the delay stages 310, 312, 314 of the oscillator circuitry 304 (e.g., by closing switches 462, 466). Similarly, in response to identifying that the digital code input to the DAC of the frequency control module 204 is less than a threshold value (or equal to zero) or that the control voltage ($V_C$) at the output of the DAC is less than a lower threshold control voltage value, the frequency control module 204 enables the selectable capacitor pair 416 across the differential output nodes 422, 424 of the main inverter circuitry 408, 410 in the delay stages 310, 312, 314 of the oscillator circuitry 304. As a result, when the switches 462, 466 are closed, the delay time (e.g., the rise time and/or fall time) of the adjustable inverter circuitry 316, 400 of the delay stages 310, 312, 314 is increased, thereby reducing ratio of the oscillation frequency ($f_{OUT}$) of the oscillator circuitry 304 to the applied reference voltage ($V_{REF}$). Thus, a given reference voltage ($V_{REF}$) and/or control voltage ($V_C$) produces an output signal with a lower output frequency ($f_{OUT}$) when the selectable capacitor pair 416 is enabled, allowing the reference voltage ($V_{REF}$) and/or control voltage ($V_C$)) to be increased. As a result, the functionality of voltage level translation circuitry 344, 346, 348 is not impaired and the DAC of the frequency control module 204 may be capable of further decreasing the control voltage ($V_C$) (and thereby the output frequency of the VCO module 206, 300) as needed.

In an exemplary embodiment, the loop defined by tasks 502, 504, 506, 508, 510, 512, and 514 repeats until the digital PLL 200 is calibrated. In this regard, in practice, the VCO module 206, 300 may be too slow, that is, the reference voltage ($V_{REF}$) and/or control voltage ($V_C$) may need to be too high to achieve the desired oscillation frequency, without the selectable inverter circuitry 412, 414 enabled, but too fast, that is, the reference voltage ($V_{REF}$) and/or control voltage ($V_C$) may need to be too low to achieve the desired oscillation frequency, when the selectable circuitry 412, 414 enabled. In such situations, one or more selectable capacitor pairs 416 may be enabled concurrently with the selectable circuitry 412, 414 to increase the effective delay time of the delay stages 310, 312, 314 by an amount less than the decrease in delay time achieved by the selectable circuitry 412, 414 to fine-tune the effective delay time of the delay stages 310, 312, 314 and achieve the desired oscillation frequency while maintaining the reference voltage ($V_{REF}$) and/or control voltage ($V_C$) within their desired ranges. In an exemplary embodiment, after the digital PLL 200 is calibrated, the VCO calibration process 500 exits and normal operation of the digital PLL 200 begins or resumes. In this regard, the oscillator gain (i.e., the ratio of the output frequency to the reference voltage and/or control voltage) is maintained fixed while the phase detection module 202 incrementally adjusts the output frequency of the VCO module 206, 300 (e.g., by turning on/off secondary current mirrors 326, 328, 330, 332) to lock the phase of the output signal ($C_{OUT}$) to the input reference signal ($C_{REF}$).

In some embodiments, the frequency control module 204 may monitor the digital PLL 200 and interrupt operation of the digital PLL 200 and reinitiate the VCO calibration process 500 in response to identifying a recalibration condition. For example, the frequency control module 204 may periodically compare the number of oscillations of the output signal ($C_{OUT}$) to the number of oscillations of the input reference signal ($C_{REF}$) to ensure the VCO module 206, 300 is calibrated to the input reference signal with the desired level of accuracy during operation of the digital PLL 200. In response to identifying that the VCO module 206, 300 is operating too slow or too fast, the frequency control module 204 may identify a recalibration condition and generate an interrupt signal that causes the digital PLL 200 to temporarily cease operations before repeating the VCO calibration process 500. In this manner, if the VCO module 206, 300 begins to operate too slowly while the selectable capacitor pair 416 is enabled, the frequency control module 204 may disable the capacitor pair 416 (e.g., by opening switching elements 462, 466) to increase the ratio of the output frequency to the applied reference voltage for the VCO module 206, 300. Similarly, if the VCO module 206, 300 is operating too fast while the selectable inverter circuitry 412, 414 is enabled, the frequency control module 204 may disable the selectable inverter circuitry 412, 414 (e.g., by providing a logical low voltage value to the control input node 406 or otherwise removing the control signal at the control input node 406) to decrease the ratio of the output frequency to the VCO reference voltage and/or control voltage. In this manner, the selectable inverter circuitry 412, 414 and/or selectable capacitor pair 416 does not unnecessarily consume power when the main inverter circuitry 408, 410 is capable of operating at the desired output frequency.

To briefly summarize, one advantage of the VCO modules described above is that the oscillator gain of a VCO may be dynamically adjusted to achieve a desired output frequency while maintaining the voltage applied to the VCO within a predetermined range of voltages. For example, when PVT variations result in relatively slow oscillator circuitry, selectable inverter circuitry may be enabled to allow the VCO to achieve relatively higher output frequencies without increasing the voltage applied to the VCO beyond a predefined upper limit. Similarly, when PVT variations result in relatively fast oscillator circuitry, selectable capacitors may be enabled to allow the VCO to achieve relatively lower output frequencies without decreasing the voltage applied to the VCO beyond a predefined lower limit. Additionally, the VCO module is suitable for use in digital PLLs by providing PVT compensated frequency adjustments in response to adjustment signals from a phase detection module.

For the sake of brevity, conventional techniques related to phase-locked loops, electronic oscillators, circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. As used herein, a "node" means any internal or external reference point, connection point, junction, signal line, conductive element, or the like, at which a given signal, logic level, voltage, data pattern, current, or quantity is present.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient and edifying road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An oscillator module comprising:
a first node for a first voltage;
a control node for a first control signal;
oscillator circuitry coupled to the first node and the control node, wherein the oscillator circuitry is configured to:
generate an output signal with a first oscillation frequency based on the first voltage in response to the first control signal having a first state; and
generate the output signal with a second oscillation frequency based on the first voltage in response to the first control signal having a second state, the second oscillation frequency being greater than the first oscillation frequency; and
a control module coupled to the control node, wherein the control module is configured to:
set the first voltage to a lower threshold voltage;
count a number of oscillations of the output signal after setting the first voltage to the lower threshold voltage, resulting in a counted number of oscillations;
increase the first voltage in a manner that is influenced by the counted number of oscillations; and
provide the first control signal in the second state in response to identifying the first voltage is greater than a threshold voltage.

2. The oscillator module of claim 1, wherein the control module is configured to:
determine an expected number of oscillations for the output signal, the expected number of oscillations corresponding to a target output frequency for the output signal;
determine a first voltage amount based on a difference between the expected number of oscillations and the counted number of oscillations; and
increase the first voltage by the first voltage amount when the counted number of oscillations is less than the expected number of oscillations.

3. The oscillator module of claim 2, wherein the control module is configured to decrease the first voltage by the first voltage amount when the counted number of oscillations is greater than the expected number of oscillations.

4. The oscillator module of claim 3, wherein:
the control module is configured to provide a second control signal in response to identifying the first voltage is less than a second threshold voltage; and
the oscillator circuitry is configured to generate the output signal with a third oscillation frequency based on the first voltage in response to the second control signal, the third oscillation frequency being less than the first oscillation frequency.

5. An oscillator module comprising:
a first node for a first voltage;
a control node for a first control signal;
oscillator circuitry coupled to the first node and the control node, wherein the oscillator circuitry is configured to:
generate an output signal with a first oscillation frequency based on the first voltage in response to the first control signal having a first state; and
generate the output signal with a second oscillation frequency based on the first voltage in response to the first control signal having a second state, the second oscillation frequency being greater than the first oscillation frequency; and
a control module coupled to the control node, wherein the control module is configured to provide the first control signal having the second state in response to identifying a digital input code for a digital-to-analog converter configured to provide the first voltage based on the digital input code is within a threshold amount of a full scale input code for the digital-to-analog converter.

6. An oscillator module comprising:
a first node for a first voltage;
a control node for a first control signal;
oscillator circuitry coupled to the first node and the control node, wherein the oscillator circuitry is configured to:
generate an output signal with a first oscillation frequency based on the first voltage in response to the first control signal having a first state; and
generate the output signal with a second oscillation frequency based on the first voltage in response to the first control signal having a second state, the second oscillation frequency being greater than the first oscillation frequency; and
a ground reference node, wherein the oscillator circuitry includes:
an input node for an input signal;
an output node;
a first inverter coupled between the first node and the ground reference node, the first inverter being configured to produce an inverted version of the input signal at the input node at the output node; and
a second inverter selectively coupled between the first node and the ground reference node electrically parallel to the first inverter in response to the first control signal having the second state, the second inverter being configured to produce the inverted version of the input signal at the input node at the output node when coupled between the first node and the ground reference node electrically parallel to the first inverter.

7. The oscillator module of claim 6, wherein:
the first inverter comprises:

a first transistor between the first node and the output node, a control terminal of the first transistor being coupled to the input node; and a second transistor between the output node and the ground reference node, a control terminal of the second transistor being coupled to the input node, wherein the first transistor and the second transistor are configured to generate the inverted version of the input signal at the output node; and the second inverter comprises:

a third transistor selectively coupled between the first node and the output node in response to the first control signal having the second state, a control terminal of the third transistor being coupled to the input node; and a fourth transistor selectively coupled between the output node and the ground reference node in response to the first control signal having the second state, a control terminal of the fourth transistor being coupled to the input node, wherein the third transistor and the fourth transistor generate the inverted version of the input signal at the output node when the third transistor is coupled to the first node and the fourth transistor is coupled to the ground reference node in response to the first control signal having the second state.

8. An oscillator module comprising:

a first node for a first voltage;

a control node for a first control signal; and oscillator circuitry coupled to the first node and the control node, wherein the oscillator circuitry is configured to:

generate an output signal with a first oscillation frequency based on the first voltage in response to the first control signal having a first state; and generate the output signal with a second oscillation frequency based on the first voltage in response to the first control signal having a second state, the second oscillation frequency being greater than the first oscillation frequency, wherein the oscillator circuitry comprises:

a first plurality of inverters configured as a ring oscillator; and a second plurality of inverters, wherein in response to the first control signal having the second state, each inverter of the second plurality of inverters is configured electrically parallel to a respective inverter of the first plurality of inverters of the oscillator circuitry between the first node and a ground reference node.

9. The oscillator module of claim 8, wherein:

each respective inverter of the first plurality of inverters is configured between the first node and the ground reference node, such that the first voltage controls a delay time of each respective inverter of the first plurality of inverters; and each respective inverter of the second plurality of inverters is configured between the first node and the ground reference node in response to the first control signal having the second state, such that the first voltage controls a delay time of each respective inverter of the second plurality of inverters.

10. The oscillator module of claim 8, wherein:

each inverter of the first plurality of inverters comprises:
an input node configured to receive an input signal;
an output node;

a first transistor configured between the first node and the output node, a control terminal of the first transistor being coupled to the input node; and a second transistor configured between the output node and the ground reference node, a control terminal of the second transistor being coupled to the input node, wherein the first transistor and the second transistor are configured to generate an inverted version of the input signal at the output node; and each inverter of the second plurality of inverters comprises:

a third transistor configured to be selectively coupled between the first node and the output node in response to the first control signal having the second state, a control terminal of the third transistor being coupled to the input node; and a fourth transistor configured to be selectively coupled between the output node and the ground reference node in response to the first control signal having the second state, a control terminal of the fourth transistor being coupled to the input node, wherein in response to the first control signal having the second state, the third transistor and the fourth transistor generate the inverted version of the input signal at the output node.

11. The oscillator module of claim 10, further comprising:

a fifth transistor configured between the first node and the third transistor, a control terminal of the fifth transistor being coupled to the control node; and a sixth transistor configured between the fourth transistor and the ground reference node, a control terminal of the sixth transistor being coupled to the control node, wherein in response to the first control signal having the second state:

the fifth transistor electrically couples the third transistor to the first node; and the sixth transistor electrically couples the fourth transistor to the ground reference node.

12. A method for operating a voltage-controlled oscillator (VCO) module, the method comprising:

providing a reference voltage to the VCO module;

generating, by the VCO module, an output signal having a first oscillation frequency, the first oscillation frequency corresponding to the reference voltage multiplied by an oscillator gain for the VCO module;

increasing the reference voltage by a first amount when a phase of the output signal lags a phase of a reference signal by less than a threshold amount;

increasing the reference voltage by a second amount when the phase of the output signal lags the phase of the reference signal by more than the threshold amount, the second amount being greater than the first amount;

increasing the oscillator gain when the reference voltage is greater than a threshold voltage; and in response to increasing the oscillator gain, generating the output signal with a second oscillation frequency based on the reference voltage, the second oscillation frequency being greater than the first oscillation frequency.

13. The method of claim 12, further comprising:

decreasing the reference voltage by the first amount when the phase of the output signal leads the phase of the reference signal by less than the threshold amount;

decreasing the reference voltage by the second amount when the phase of the output signal leads the phase of the reference signal by more than the threshold amount; and decreasing the oscillator gain in response to identifying the reference voltage is less than a second threshold voltage.

* * * * *